United States Patent
Kim

(10) Patent No.: US 8,143,709 B2
(45) Date of Patent: Mar. 27, 2012

(54) SEMICONDUCTOR PACKAGE HAVING SOLDER BALL WHICH HAS DOUBLE CONNECTION STRUCTURE

(75) Inventor: Hye-Jin Kim, Suwon-si (KR)

(73) Assignee: Samsung Electronics Co., Ltd, Suwon-Si (KR)

( * ) Notice: Subject to any disclaimer, the term of this patent is extended or adjusted under 35 U.S.C. 154(b) by 0 days.

(21) Appl. No.: 12/474,429

(22) Filed: May 29, 2009

(65) Prior Publication Data

US 2010/0090324 A1    Apr. 15, 2010

Related U.S. Application Data

(63) Continuation-in-part of application No. 12/251,534, filed on Oct. 15, 2008, now Pat. No. 8,026,584.

(30) Foreign Application Priority Data

Dec. 26, 2008    (KR) .................. 10-2008-0134981

(51) Int. Cl.
*H01L 23/02*    (2006.01)
(52) U.S. Cl. . 257/686; 257/698; 257/737; 257/E23.023; 257/E23.011; 257/E23.141
(58) Field of Classification Search .................. 257/686, 257/698, 737, E23.023, E23.011, E23.141, 257/685
See application file for complete search history.

(56) References Cited

U.S. PATENT DOCUMENTS

| | | | | |
|---|---|---|---|---|
| 5,969,424 A | * | 10/1999 | Matsuki et al. | 257/768 |
| 7,235,870 B2 | | 6/2007 | Punzalan, Jr. et al. | |
| 7,279,785 B2 | | 10/2007 | Ha et al. | |
| 2007/0158843 A1 | * | 7/2007 | Kim et al. | 257/738 |
| 2007/0246813 A1 | * | 10/2007 | Ong et al. | 257/686 |
| 2009/0146282 A1 | * | 6/2009 | Tay et al. | 257/686 |

FOREIGN PATENT DOCUMENTS

KR    20080051658    6/2008

* cited by examiner

*Primary Examiner* — Bradley K Smith
*Assistant Examiner* — Mohammad T Karimy
(74) *Attorney, Agent, or Firm* — Stanzione & Kim, LLP

(57) ABSTRACT

A semiconductor package having a solder ball having a double connection structure which reduces a total height of a package on package (POP). The semiconductor package includes a first semiconductor package in which a semiconductor device is mounted on a lower surface of a first substrate, and a through hole is formed in a solder ball pad region of the first substrate, a second semiconductor package in which a semiconductor device is mounted on an upper surface of a second substrate, and a solder ball pad of the second substrate is formed to correspond to the through hole of the first substrate and is mounted on the first substrate, and a common solder ball that is disposed below the first substrate and is connected to the solder ball pad of the second substrate through the through hole.

9 Claims, 3 Drawing Sheets

SEMICONDUCTOR PACKAGE HAVING SOLDER BALL WHICH HAS DOUBLE CONNECTION STRUCTURE

CROSS-REFERENCE TO RELATED APPLICATIONS

This application is a Continuation In-part Application of U.S. patent Ser. No. 12/251,534, filed on Oct. 15, 2008 now U.S. Pat. No. 8,026,584, in the U.S. Patent and Trademark Office, and claims priority under 35 U.S.C. 119(a) from Korean Patent Application No. 10-2008-0134981 filed on Dec. 26, 2008, in the Korean Intellectual Property Office and under 35 U.S.C. 120 from U.S. patent application Ser. No. 12/251,534 filed on Oct. 15, 2008 in the U.S. Patent and Trademark Office, the disclosures of which are incorporated herein in their entirety by reference.

BACKGROUND

1. Field of the Invention

The present general inventive concept relates to a semiconductor package, and more particularly, to a semiconductor package having a package on package (POP) structure whose total height can be reduced and reliability can be improved.

2. Description of the Related Art

Recently, mobile devices such as mobile phones are developed to be more compact while at the same time having multiple functions. Accordingly, semiconductor packages mounted in the mobile devices are also developed to be compact and have multiple functions. An example of such semiconductor packages having a compact size and multiple functions is a package on package (POP). The POP includes two semiconductor packages that are connected on top of one another to form one semiconductor package.

Unlike a multi chip package (MCP), the POP can be used to employ various types of memories into one semiconductor package according to the user's need. Also, diverse semiconductor chips having different functions can be mounted in one semiconductor package using the POP. Meanwhile, each of the semiconductor packages used in the POP are assembly-finished and an electrical test is performed thereon. Thus, when a final electrical test is conducted on the POP, a problem such as a decrease in yield can be found.

SUMMARY

The present general inventive concept provides a semiconductor package having a solder ball having a double connection structure, whereby the total height of the semiconductor package can be reduced, the manufacturing process of the semiconductor package can be simplified, defects generated during the manufacturing process thereof can be reduced, and reliability thereof can be improved.

Additional aspects and utilities of the present general inventive concept will be set forth in part in the description which follows and, in part, will be obvious from the description, or may be learned by practice of the general inventive concept.

Exemplary embodiments of the present general inventive concept provide a semiconductor package includes a solder ball having a double connection structure, the semiconductor package having a first substrate including a through hole therein, a conductor formed on a sidewall of the through hole, a semiconductor device mounted on the first substrate, and a solder ball disposed in the through hole and connecting a contact point between the conductor and the semiconductor device.

The semiconductor device may be a semiconductor package to which a solder ball is not attached, and the semiconductor device having a second substrate including a solder ball pad on a lower portion of the second substrate, a semiconductor chip mounted on an upper surface of the second substrate, a wire connecting the semiconductor chip and the second substrate, and a sealing resin encapsulating the upper surface of the second substrate, the semiconductor chip, and the wire.

The contact point of the semiconductor device may be the solder ball pad of the semiconductor package. The through hole of the first substrate and the solder ball pad of the second substrate may be located at corresponding positions, to be bonded to each other.

A semiconductor device may be further formed on a lower surface of the first substrate.

Exemplary embodiments of the present general concept provide a semiconductor package including a first semiconductor package in which a semiconductor device is mounted on a lower surface of a first substrate, and a through hole is formed in a solder ball pad region of the first substrate, a second semiconductor package in which a semiconductor device is mounted on an upper surface of a second substrate, and a solder ball pad of the second substrate is formed to correspond to the through hole of the first substrate and mounted on the first substrate, and a common solder ball that is disposed below the first substrate and is connected to the solder ball pad of the second substrate through the through hole.

The common solder ball may bond the first semiconductor package to the second semiconductor package, and may be an external connection terminal of the first and second semiconductor packages at the same time.

The height of the common solder ball may be higher than the height of the semiconductor device mounted on the lower surface of the first substrate.

A conductor may be formed on a sidewall of the through hole of the first substrate, and an aperture of the solder ball pad of the second substrate may be larger than an aperture of the through hole of the first substrate.

The semiconductor devices mounted on the first and second substrates may be semiconductor chips that perform different functions from each other.

Exemplary embodiments of the present general inventive concept also provide a method of manufacturing a semiconductor package, the method including forming a though hold on a first substrate and mounting a plurality of semiconductor chips on the first substrate, forming a second semiconductor package having a second substrate with a plurality of semiconductor chips mounted thereon and a solder ball pad not including a solder ball, and aligning the second substrate on the first substrate.

The method may further include coating the solder ball pad of the second semiconductor package with an adhesion material.

The method may further include aligning the second semiconductor package on the first semiconductor package such that the solder ball pad of the second semiconductor package and the through hole of the first semiconductor package are located at corresponding positions.

The method may further include bonding the through hole of the first semiconductor package and the solder ball of the second semiconductor package to one another.

Exemplary embodiments of the present general inventive concept also provide a method of manufacturing a semiconductor package with a solder ball having a double connection structure, the method including forming a first substrate including a through hole therein, forming a conductor on a sidewall of the through hole, mounting a semiconductor device on the first substrate, and disposing a solder ball in the through hole and connecting a contact point between the conductor and the semiconductor device.

The method may further include forming a second substrate including a solder ball pad on a portion of the second substrate, a semiconductor chip mounted on a first surface of the second substrate, a wire connecting the semiconductor chip and the second substrate, and a sealing resin encapsulating the first surface of the second substrate, the semiconductor chip, and the wire, where the semiconductor device is a semiconductor package to which a solder ball is not attached.

The method may further include where the contact point of the semiconductor device is the solder ball pad of the semiconductor package.

The method may further include locating the through hole of the first substrate and the solder ball pad of the second substrate at corresponding positions, and bonding the through hole and the solder ball pad to each other.

The method may further include forming a semiconductor device is further formed on a surface of the first substrate.

Exemplary embodiments of the present general inventive concept also provide a method of manufacturing a semiconductor package, the method including forming a first semiconductor package in which a semiconductor device is mounted on a first surface of a first substrate, and forming a through hole in a solder ball pad region of the first substrate, forming a second semiconductor package in which a semiconductor device is mounted on an upper surface of a second substrate, and forming a solder ball pad of the second substrate to correspond to the through hole of the first substrate and mounted on the first substrate, disposing a common solder ball adjacent to the first substrate, and connecting the solder ball pad of the second substrate through the through hole.

The method may further include bonding the first semiconductor package to the second semiconductor package with the common solder ball.

The method may further include where the height of the common solder ball is higher than the height of the semiconductor device mounted on the lower surface of the first substrate.

The method may further include forming a conductor on a sidewall of the through hole of the first substrate.

The method may further include forming an aperture of the solder ball pad of the second substrate that is larger than an aperture of the through hole of the first substrate.

Exemplary embodiments of the present general inventive concept also provide a semiconductor package, including a substrate having at least one through hole, a conductor disposed on a sidewall of the at least one through hole, a semiconductor chip mounting portion disposed on a surface of the substrate, in which at least one of a plurality of semiconductor chips are mounted, bond fingers disposed on the surface of the substrate, and wires electrically coupled between the plurality of semiconductor chips and the bond fingers.

Exemplary embodiments of the present general inventive concept also provide a semiconductor package, including a substrate having a first surface and a second surface, a bond finger disposed on the first surface of the substrate, a solder ball disposed on the second surface of the substrate, a plurality of semiconductor chips, where at least one of the plurality of semiconductor chips mounted on the first surface of substrate, and wires electrically coupled between the plurality of semiconductor chips and the bond finger.

Exemplary embodiments of the present general inventive concept also provide a semiconductor package, including a first substrate having a first surface and a second surface, the first substrate having a through hole and a conductor disposed on a sidewall of the at least one through hole, a semiconductor chip mounting portion disposed on a second surface of the first substrate, in which at least one of a plurality of semiconductor chips are mounted, a second substrate having a first surface and a second surface, the second surface of the second substrate mounted on the first surface of the first substrate, the second substrate having a plurality of semiconductor chips, where at least one of the plurality of semiconductor chips mounted on the first surface of second substrate, and a solder ball pad disposed on the second surface of the second substrate, and a solder ball disposed in the through hole of the first substrate to connect a contact point between the conductor of the first substrate and the solder ball pad of the second substrate.

BRIEF DESCRIPTION OF THE DRAWINGS

These and/or other features and utilities of the present general inventive concept will become apparent and more readily appreciated from the following description of the embodiments, taken in conjunction with the accompanying drawings of which.

DETAILED DESCRIPTION OF THE EMBODIMENTS

Figure 1:
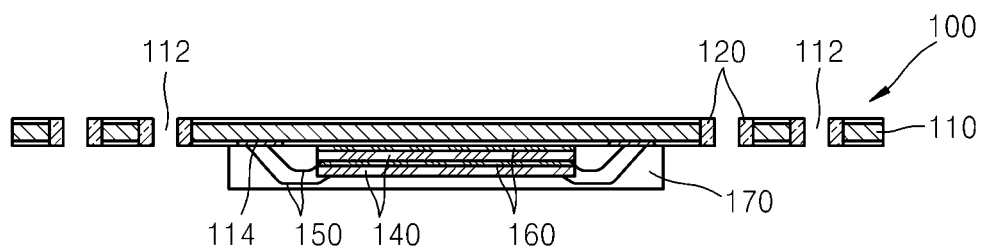
FIG. 1 is a cross-sectional view illustrating a first semiconductor package according to an exemplary embodiment of the present general inventive concept.

The present general inventive concept will now be described more fully with reference to the accompanying drawings, in which exemplary embodiments of the inventive concept are illustrated. The present general inventive concept may, however, be embodied in many different forms and should not be construed as being limited to the embodiments set forth herein; rather, these embodiments are provided so that this disclosure will be thorough and complete, and will fully convey the concept of the inventive concept to those of ordinary skill in the art.

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

FIG. 1 is a cross-sectional view illustrating a first semiconductor package 100 according to an embodiment of the present general inventive concept.

Referring to FIG. 1, the first semiconductor package 100 according to an exemplary embodiment of the present general inventive concept includes a first substrate 110, in which a through hole 112 is formed, as a basic frame. A conductor 120 is formed on a sidewall of the through hole 112, and a semiconductor chip mounting portion, in which a semiconductor device such as a semiconductor chip 140 can be mounted, is formed on a lower surface of the first substrate 110. Accordingly, a plurality of the semiconductor chips 140 may be vertically stacked on the lower surface of the first substrate 110 via an adhesion unit 160. The adhesion unit 160 may be an adhesive tape or liquid epoxy. Alternatively, semiconductor chips 140 may be vertically stacked as illustrated, for example, in FIGS. 4 and 5 and described in the corresponding descriptions related thereto of U.S. patent application Ser. No. 12/251,534, which is incorporated herein in its entirety by reference. The semiconductor chips 140 are electrically connected via wires 150 to bond fingers 114 formed on the lower surface of the first substrate 110. The semiconductor chips 140, the wires 150, and the bond fingers 114 may be encapsulated using a sealing resin 170 and are thereby protected from external shocks.

As illustrated in FIG. 1, the semiconductor chips 140 may be electrically connected to the first substrate 110 via the wires 150. Alternatively, the semiconductor chips 140 may be connected to the first substrate 110 using a bump that is formed in the semiconductor chips 140. Also, although the semiconductor chips 140 are illustrated as being vertically stacked, the semiconductor chips 140 may also be mounted on the lower surface of the first substrate 110 horizontally.

A characteristic of the first semiconductor package 110 is that the through hole 112 is formed in the first substrate 110 corresponding to a position where a solder ball is to be mounted, and semiconductor devices such as the semiconductor chips 140 are mounted on the lower surface of the first substrate 110 in a face-down manner.

Figure 2:
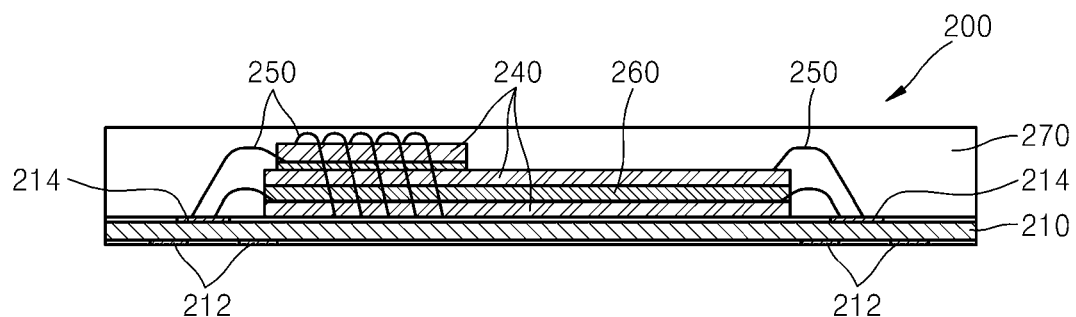
FIG. 2 is a cross-sectional view illustrating a second semiconductor package according to an exemplary embodiment of the present general inventive concept.

FIG. 2 is a cross-sectional view illustrating a second semiconductor package 200 according to an embodiment of the present general inventive concept.

Referring to FIG. 2, the second semiconductor package 200 according to the exemplary embodiment includes a second substrate 210, on which a bond finger 214 is formed and under which a solder ball pad 212 is formed, as a basic frame.

A plurality of semiconductor chips 240 are mounted on the second substrate 210 via an adhesion unit 260 in a face-up manner. The adhesion unit 260 may be an adhesive tape or liquid epoxy. Alternatively, semiconductor chips 240 may be vertically stacked as illustrated, for example, in FIGS. 4 and 5 and described in the corresponding descriptions related thereto of U.S. patent application Ser. No. 12/251,534, which is incorporated herein in its entirety by reference. The semiconductor chips 240 are electrically connected to the bond finger 214 formed on the second substrate 210 via wires 250. The semiconductor chips 240, the wires 250, and the bond fingers 214 may be encapsulated using a sealing resin 270 and are thereby protected from external shocks.

In FIG. 2, the semiconductor chips 240 are illustrated as being electrically connected to the second substrate 210 via the wires 250. Alternatively, the semiconductor chips 240 may be connected to the second substrate 210 using a bump that is formed in the semiconductor chips 240. Also, although the semiconductor chips 240 are illustrated as being vertically stacked, the semiconductor chips 240 may also be mounted on the lower surface of the second substrate 210 horizontally.

A characteristic of the second semiconductor package 200 is that the solder ball pad 212 formed on a lower surface of the second substrate 210 is formed in a position corresponding to the through hole 112 of the first semiconductor package 100 of FIG. 1. In other words, when an upper surface of the first substrate 110 of the first semiconductor package 100 is bonded to a lower surface of the second substrate 210 of the second semiconductor package 200, the solder ball pad 212 and the through hole 112 may preferably be located at corresponding positions, to be bonded to each other.

According to an embodiment of the present general inventive concept, the semiconductor chips 140 and 240 mounted in the first semiconductor package 100 and the second semiconductor package 200 may be formed of a combination of a memory device and a logic device or a combination of a memory multi-chip package (MCP) and a NAND flash device or a controller device. That is, semiconductor chips performing different functions may be mounted in the first and second semiconductor packages 100 and 200.

Figure 3:
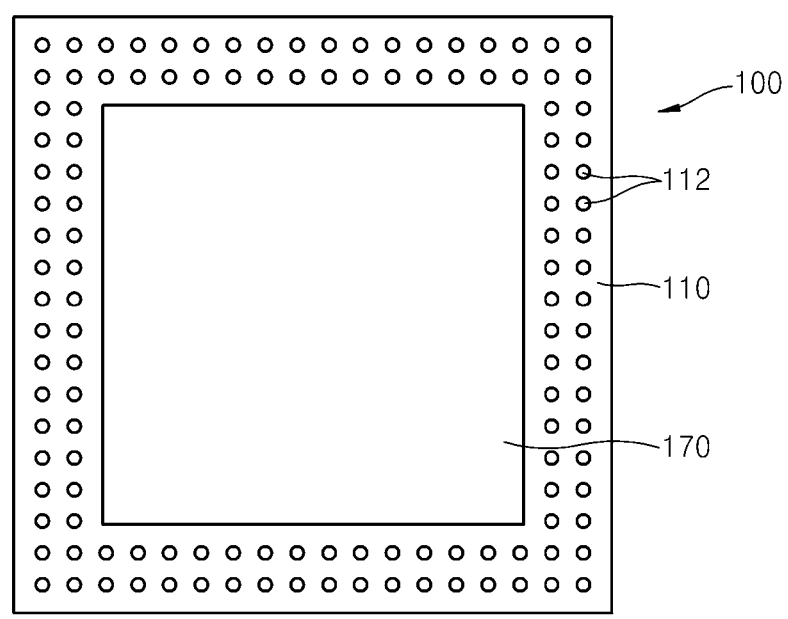
FIG. 3 is a bottom view illustrating through holes formed in a first substrate used in the first semiconductor package.
Figure 4:
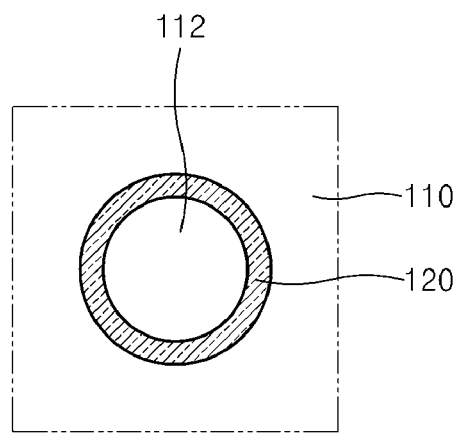
FIG. 4 is a plan view illustrating the structure of a through hole illustrated in FIG. 3.

FIG. 3 is a bottom view illustrating the through holes 112 formed in the first substrate 110 used in the first semiconductor package 100, and FIG. 4 is a plan view illustrating the structure of the through hole 112 illustrated in FIG. 3.

Referring to FIGS. 3 and 4, the first substrate 110 which is the basic frame of the first semiconductor package 100 includes the sealing resin 170 on a center portion of the lower surface of the first substrate 110. The sealing resin 170 protects the semiconductor chips 140, the wires 150, and the bond fingers 114. A plurality of the through holes 112 are arranged in two rows on an outer portion of the sealing resin 170.

FIG. 3 illustrates that the through holes 112 are arranged in two rows. The through holes 112 may also be arranged in three rows or in another arrangement. The conductor 120 is formed on a sidewall of each of the through holes 112 as illustrated in FIG. 4. The conductor 120 may be a single metal layer, including one of nickel, gold, and tin, which is bonded using a solder, or may be a multi-layered structure including the single metal layer. Also, the first substrate 110 may be a two-sided substrate or a multi-layered substrate.

Figure 5:
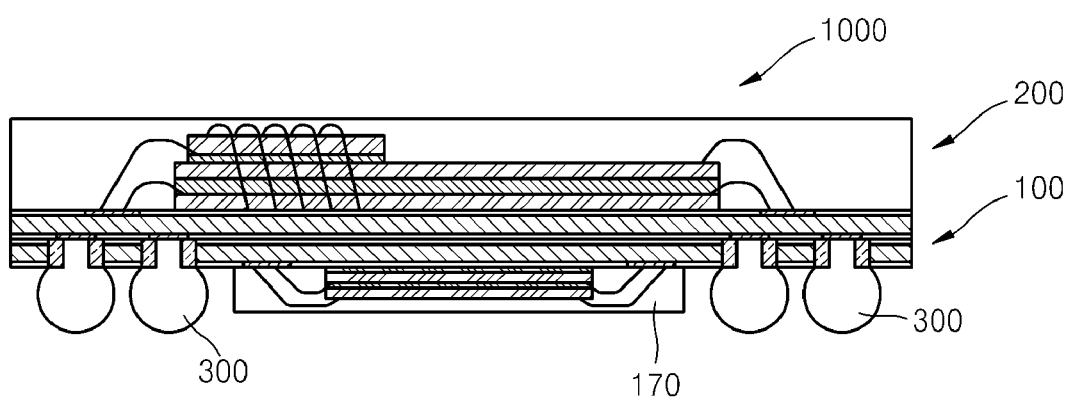
FIG. 5 is a cross-sectional view illustrating a semiconductor package having a solder ball having a double connection structure according to an exemplary embodiment of the present general inventive concept.
Figure 6:
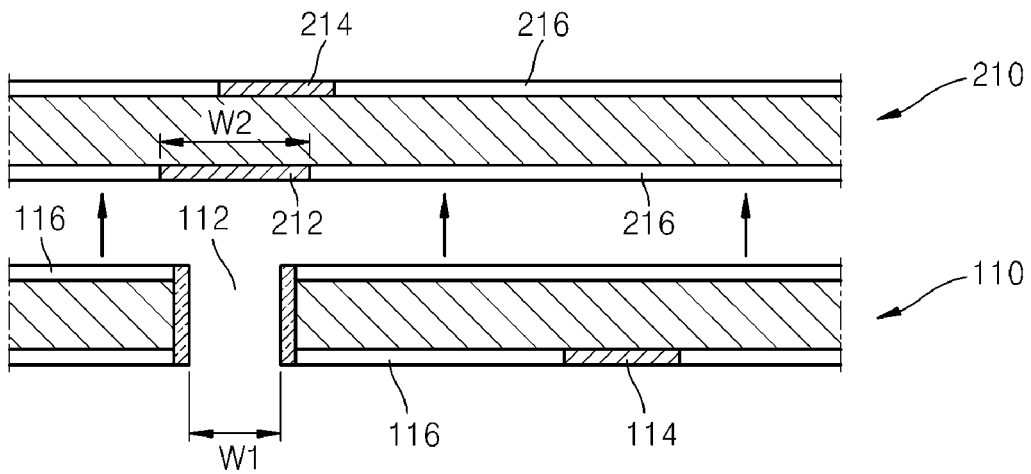
FIG. 6 is a partial cross-sectional view of the semiconductor package of FIG. 5 for illustrating the connection structure of first and second substrates.

FIG. 5 is a cross-sectional view illustrating a semiconductor package 1000 having a solder ball having a double connection structure according to an embodiment of the present general inventive concept, and FIG. 6 is a partial cross-sectional view of the semiconductor package 1000 of FIG. 5 illustrating the connected structure of first and second substrates 110 and 210.

Referring to FIGS. 5 and 6, a width W2 of the solder ball pad 212 formed on the lower surface of the second semiconductor package 200 may preferably be wider than a width W1 of the through hole 112 formed in the first substrate 110 of the first semiconductor package 100, as illustrated in FIG. 6. Accordingly, when aligning the second semiconductor package 200 on the first semiconductor package 100, the solder ball pad 212 and the through hole 112 may be connected to each other via a solder ball 300 even when a small alignment error is present.

Surfaces of the first and second substrates 110 and 210 on which the solder ball pad 212, the bond fingers 114 or 214, and the through hole 112 are not formed respectively, are covered using solder resists 116 and 216, respectively, to insulate the adjacent bond fingers 114 or 214 from the solder ball pad 212. Accordingly, as the through hole 112 of the first substrate 110 and the solder ball pad 212 of the second substrate 210 are aligned to each other as illustrated in FIG. 6, the solder ball 300 is disposed in the through hole 112 and melted and attached by using a reflow process.

The solder ball 300 physically bonds the first semiconductor package 100 to the second semiconductor package 200, and is an external connection terminal to the first semiconductor package 100 and the second semiconductor package 200. The solder ball 300 may be a common solder ball for the first and second semiconductor packages 100 and 200.

The height of the common solder ball 300 may preferably be higher than that of the sealing resin 170 as illustrated in FIG. 5. Consequently, the semiconductor package 1000 having a solder ball having a double connection structure according to the exemplary embodiments of the present general inventive concept can be stably mounted in a printed circuit board such as a motherboard.

The semiconductor package 1000 having a solder ball having a double connection structure according to exemplary embodiments uses the common solder ball 300 for both the first and second semiconductor packages 100 and 200, and thus the total height of the semiconductor package 1000 having a solder ball having a double connection structure can be reduced. In addition, since processes of attaching the solder ball 300 and bonding the first and second semiconductor packages 100 and 200 to each other are conducted at the same time, the manufacturing process can be simplified. In addition, manufacturing defects such as non-wets, which are likely to be generated when the first and second semiconductor packages 100 and 200 each include a solder ball and are bonded to each other, can be minimized or prevented. Also, the first substrate 100 can be protected from being damaged which is likely to occur if the first and second substrates 110 and 210 are treated individually, or potential damage may at least be minimized. As the first and second substrates 110 and 210 having similar thermal expansion coefficients are bonded to each other via the common solder ball 300, solder joint reliability of the semiconductor package 1000, which is tested by performing a temperature cycling reliability test, can be improved.

Figure 7:
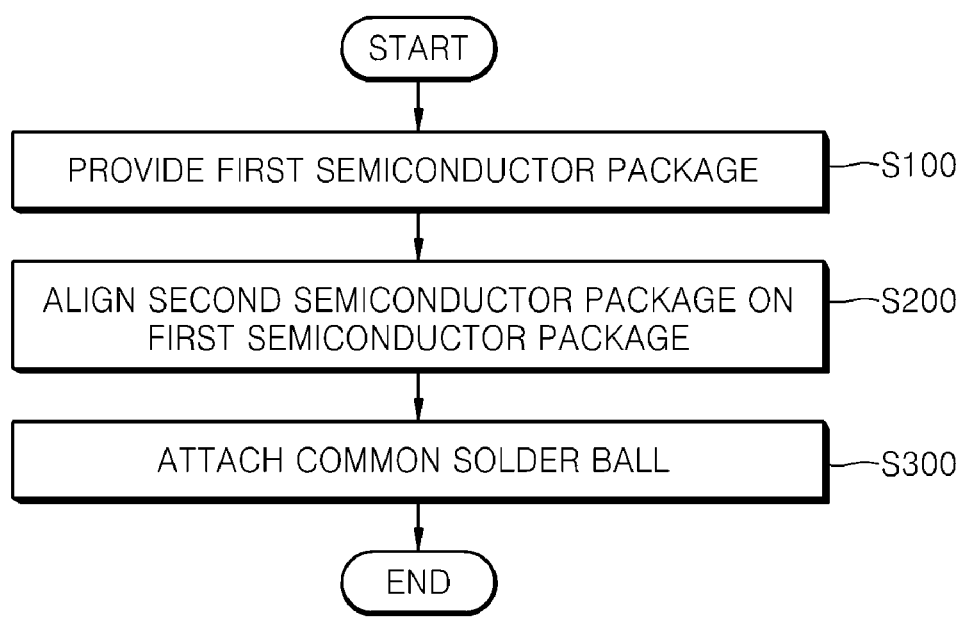
FIG. 7 is a flowchart illustrating a method of manufacturing a semiconductor package having a solder ball having a double connection structure according to an exemplary embodiment of the present general inventive concept.

FIG. 7 is a flowchart illustrating a method of manufacturing a semiconductor package having a solder ball having a double connection structure according to an exemplary embodiment of the present general inventive concept.

Referring to FIG. 7, in operation S100, a first semiconductor package, in which a through hole is formed in a first substrate and a plurality of semiconductor chips are mounted on a lower surface of the first substrate as illustrated in FIG. 1, is provided. Next, in operation S200, a second semiconductor package, in which semiconductor chips are mounted on an upper surface of a second substrate and a solder ball pad not including a solder ball is formed on a lower surface of the second substrate as is illustrated in FIG. 2, is aligned on the first semiconductor package. An adhesion unit, such as solder paste, may be coated on the solder ball pad of the second semiconductor package.

Also, the second semiconductor package may be aligned on the first semiconductor package such that the solder ball pad of the second semiconductor package and the through hole of the first semiconductor package are located at corresponding positions, to be bonded to each other.

In operation S300, a common solder ball is melted below the first substrate of the first semiconductor package to be attached. Thus, the common solder ball bonds the first and second semiconductor packages to each other, and has a double connection structure in that the solder ball is not only attached to the first substrate but also to the solder ball pad of the second substrate. Alternatively, the solder ball attached to the first substrate may be connected to the second substrate only, and form a dummy solder ball that is not connected to the first substrate.

According to the exemplary embodiments of the present general inventive concept, a solder ball may be attached only to a first semiconductor package which is disposed as a lower package in a package on package (POP) formed of two semiconductor packages connected on top of one another. Thus the total height of a semiconductor package can be reduced.

Processes of connecting the two semiconductor packages and attaching a solder ball in a POP may be conducted at the same time. Accordingly, the manufacturing process can be simplified, thereby increasing productivity and reducing manufacturing costs.

Process defects such as non-wet defects, which are likely to occur when two semiconductor packages are bonded to each other from above and below, can be reduced.

A connection portion of the solder ball is a solder ball pad of the first and second substrates, which have similar thermal expansion coefficients, and thus solder joint reliability, which is tested by performing a temperature cycling reliability test, can be improved.

The general inventive concepts illustrated and described in U.S. patent application Ser. No. 12/251,534 incorporated by reference in its entirety for coupling semiconductor packages onto circuit boards may be applied to the present general inventive concept of coupling semiconductor packages to one another, or, as discussed above, coupling multiple semiconductor devices together on a substrate.

Although several embodiments of the present general inventive concept have been illustrated and described, it will be appreciated by those skilled in the art that changes may be made in these embodiments without departing from the principles and spirit of the general inventive concept, the scope of which is defined in the appended claims and their equivalents.

What is claimed is:

1. A semiconductor package comprising:
   a first semiconductor package in which a semiconductor device is mounted on a lower surface of a first substrate, and a through hole is formed in a solder ball pad region of the first substrate;
   a second semiconductor package in which a semiconductor device is mounted on an upper surface of a second substrate, and a solder ball pad of the second substrate is formed to correspond to the through hole of the first substrate and mounted on the first substrate; and
   a common solder ball that is disposed below the first substrate and is singly and directly connected to the solder ball pad of the second substrate through the through hole.

2. The semiconductor package of claim 1, wherein the common solder ball bonds the first semiconductor package to the second semiconductor package, and is an external connection terminal of the first and second semiconductor packages at the same time.

3. The semiconductor package of claim 1, wherein the height of the common solder ball is higher than the height of the semiconductor device mounted on the lower surface of the first substrate.

4. The semiconductor package of claim 1, wherein a conductor is formed on a sidewall of the through hole of the first substrate.

5. The semiconductor package of claim 1, wherein an aperture of the solder ball pad of the second substrate is larger than an aperture of the through hole of the first substrate.

6. The semiconductor package of claim 1, wherein the semiconductor devices mounted on the first and second substrates are semiconductor chips that perform different functions from each other.

7. A semiconductor package comprising:
- a first semiconductor package having a first side and a second side, the first semiconductor package having at least one through hole therein from the first side to the second side, the through hole having a first width, a conductor formed on a sidewall of the at least one through hole, and a semiconductor device mounted on the second side of the first semiconductor package;
- a second semiconductor package having a first side and a second side, with a solder ball pad disposed on the second side having a second width that is greater than the first width of the through hole, where the solder ball pad is aligned to the through hole of the first semiconductor package; and
- conductive materials disposed in the through hole from the second side of the first substrate that is singly and directly attached to the solder ball pad of the second substrate.

8. The semiconductor package of claim 7, wherein the conductive materials bond the first semiconductor package to the second semiconductor package, and is an external connection terminal of the first and second semiconductor packages at the same time.

9. The semiconductor package of claim 7, wherein the height of the conductive materials is higher than the height of the semiconductor device mounted on the lower surface of the first substrate.

* * * * *